United States Patent [19]

Ogita

[11] 4,164,624
[45] Aug. 14, 1979

[54] DEMODULATION CIRCUITS OF FM STEREOPHONIC RECEIVERS

[75] Inventor: Minoru Ogita, Hamamatsu, Japan

[73] Assignee: Nippon Gakki Seizo Kabushiki Kaisha, Hamamatsu, Japan

[21] Appl. No.: 861,606

[22] Filed: Dec. 19, 1977

[30] Foreign Application Priority Data

Dec. 20, 1976 [JP] Japan .................. 51-153260

[51] Int. Cl.² ................................. H04H 5/00
[52] U.S. Cl. .................... 179/1 GD; 329/124
[58] Field of Search ............ 179/15 BT; 325/36; 329/124, 168, 173

[56] References Cited

U.S. PATENT DOCUMENTS

| 3,949,314 | 4/1976 | Machida | 329/124 |
| 4,047,116 | 9/1977 | Ogita | 179/15 BT |
| 4,069,398 | 1/1978 | Fujie | 179/15 BT |
| 4,076,963 | 2/1978 | Fujie et al. | 179/1 GD |

FOREIGN PATENT DOCUMENTS 49-90805 8/1974 Japan .
51-89302 8/1976 Japan .

Primary Examiner—Kathleen H. Claffy
Assistant Examiner—Kenneth A. Chayt
Attorney, Agent, or Firm—Townsend and Townsend

[57] ABSTRACT

A demodulation circuit for an FM stereo receiver is constructed to invert the FM stereo composite signal by an inverting amplifier and then to supply the inverted signal to a switching circuit for producing demodulated left and right signals. The composite signal is applied to a phase-locked loop circuit for applying a 38 kHz switching signal to the switching circuit. A 19 kHz signal produced by the phase-locked loop circuit is converted into a sine wave signal by a waveform converting circuit. The sine wave signal is converted into a direct current signal which is applied to one input of a level comparator having the other input connected to receive the 19 kHz pilot signal extracted from the composite signal. The output of the comparator is sent to a level control circuit which controls the level of the signal supplied to the input of the inverting amplifier. Accordingly, the pilot signal is canceled in the signal sent to the switching circuit. The left and right output terminals of the switching circuit are connected to the input of the inverting amplifier through negative feedback circuits.

7 Claims, 6 Drawing Figures

F I G. 1
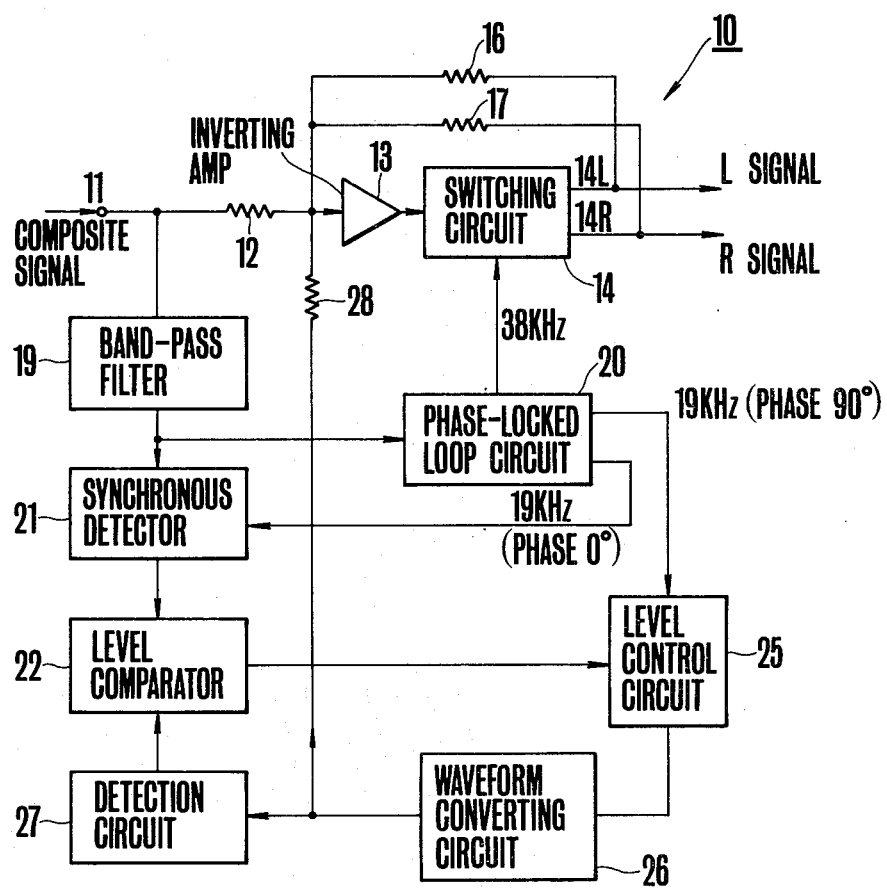

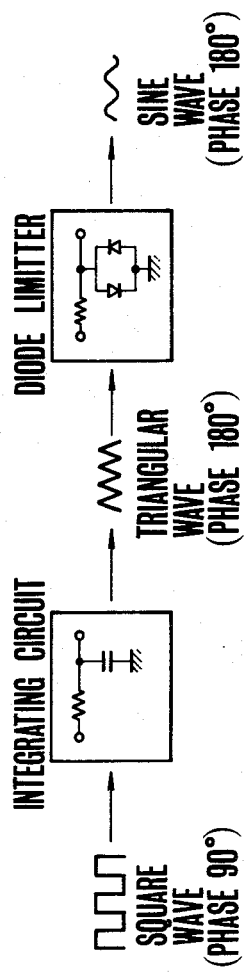
F I G. 3
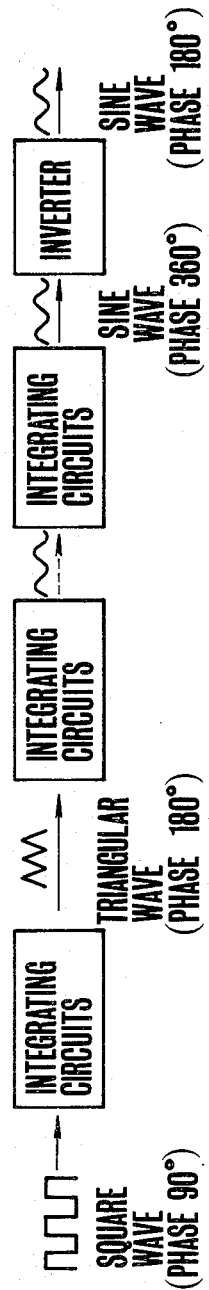
F I G. 4
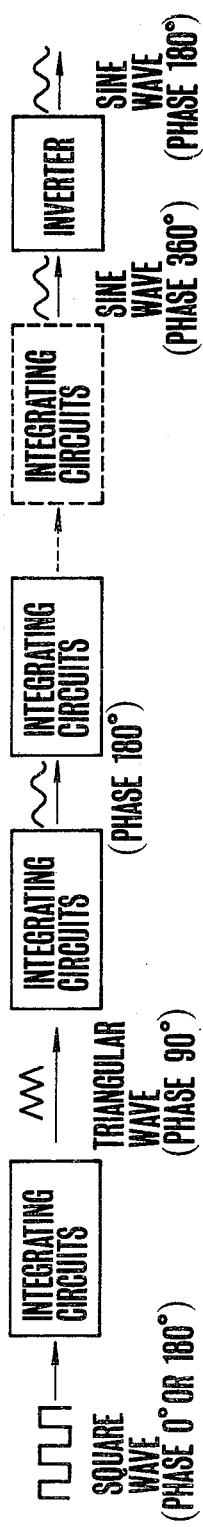
F I G. 5

DEMODULATION CIRCUITS OF FM STEREOPHONIC RECEIVERS

BACKGROUND OF THE INVENTION

This invention relates to a demodulation circuit of a frequency-modulated (FM) stereo receiver, and more particularly to a demodulation circuit of an FM stereo receiver of the pilot tone type in which FM stereo input composite signals are demodulated by a switching circuit.

A prior art demodulation circuit of the type referred to above is constructed to separate left and right signals from a composite signal and to remove a pilot tone from these signals. More particularly in the FM system, a signal having a frequency of 19 kHz is used as the pilot signal and this frequency is contained in an audio frequency band of from 20 to 20,000 Hz which is necessary for the stereo signal so that it is impossible to regenerate the stereo signal at high fidelity unless the pilot signal is removed.

A system for eliminating the pilot signal contained in the composite signal has been proposed as disclosed in Japanese patent application laid open specification No. 89302 of 1976 published on Aug. 5, 1976. In the demodulation circuit disclosed therein, the level of the pilot signal contained in the composite signal is detected, and the pilot signal is eliminated from the composite signal by a rectangular wave signal or a sine wave signal which is synchronized with the pilot signal and proportional to the detected level. The composite signal from which the pilot signal has been eliminated is used to demodulate the stereo signal. Although this circuit can substantially completely eliminate the pilot signal from the composite signal it is necessary to provide an elimination circuit which synthesizes the composite signal and an elimination signal on the input side of the switching circuit. However, the composite signal and the elimination signal cannot be synthesized in a satisfactory manner unless the impedance on the input side of the switching circuit is lower than a certain limit. Unless this condition is met, the pilot signal is not completely eliminated, and performance of the receiver suffers accordingly. Moreover, noise is picked up and transmitted to the switching circuit thus affecting the separation at the time of demodulating the composite signal. This also lowers the S/N ratio of the demodulated left and right signals, with further attendant deterioration in performance.

SUMMARY OF THE INVENTION

Accordingly, it is a principal object of this invention to provide a novel demodulation circuit of an FM stereo receiver capable of completely removing a pilot signal having a frequency of 19 kHz, for example, and contained in an FM stereo composite signal, reducing the impedance on the input side of a switching circuit and eliminating distortion formed in the switching circuit.

According to this invention there is provided a demodulation circuit of an FM stereo receiver comprising an inverting amplifier for inverting an FM stereo composite signal; a switching circuit connected to the output of the inverting amplifier for producing left and right signals on its left and right output terminals; negative feedback circuits connected between the input of the inverting amplifier and the left and right output terminals respectively; a phase-locked loop circuit which generates a switching signal in response to a pilot signal contained in the composite signal for controlling the switching circuit; a waveform converting circuit for converting a square wave produced by the phase-locked loop circuit and having a predetermined frequency into a sine wave; a circuit for supplying the output of the waveform converting circuit to the input of the inverting amplifier; a detection circuit for converting the output of the waveform converting circuit into a direct current signal; a synchronous detection circuit for synchronously detecting the pilot signal contained in the composite signal in accordance with the square wave produced by the phase-locked loop circuit for obtaining a direct current output; a level comparator for comparing the levels of the output from the synchronous detection circuit and of the output from the detection circuit; and a level control circuit responsive to the output of the level comparator for controlling the level of the signal supplied to the detection circuit from the phase-locked loop circuit through the waveform converting circuit.

BRIEF DESCRIPTION OF THE DRAWINGS

Further objects and advantages of this invention can be more fully understood from the following description taken in conjunction with the accompanying drawings in which:

FIG. 1 is a block diagram showing the basic construction of the demodulation circuit of an FM stereo receiver embodying the invention;

FIGS. 3, 4 and 5 are block diagrams showing some examples of the waveform converting circuit utilized in the circuits shown in FIGS. 1 and 2.

DESCRIPTION OF THE PREFERRED EMBODIMENT

Figure 2:
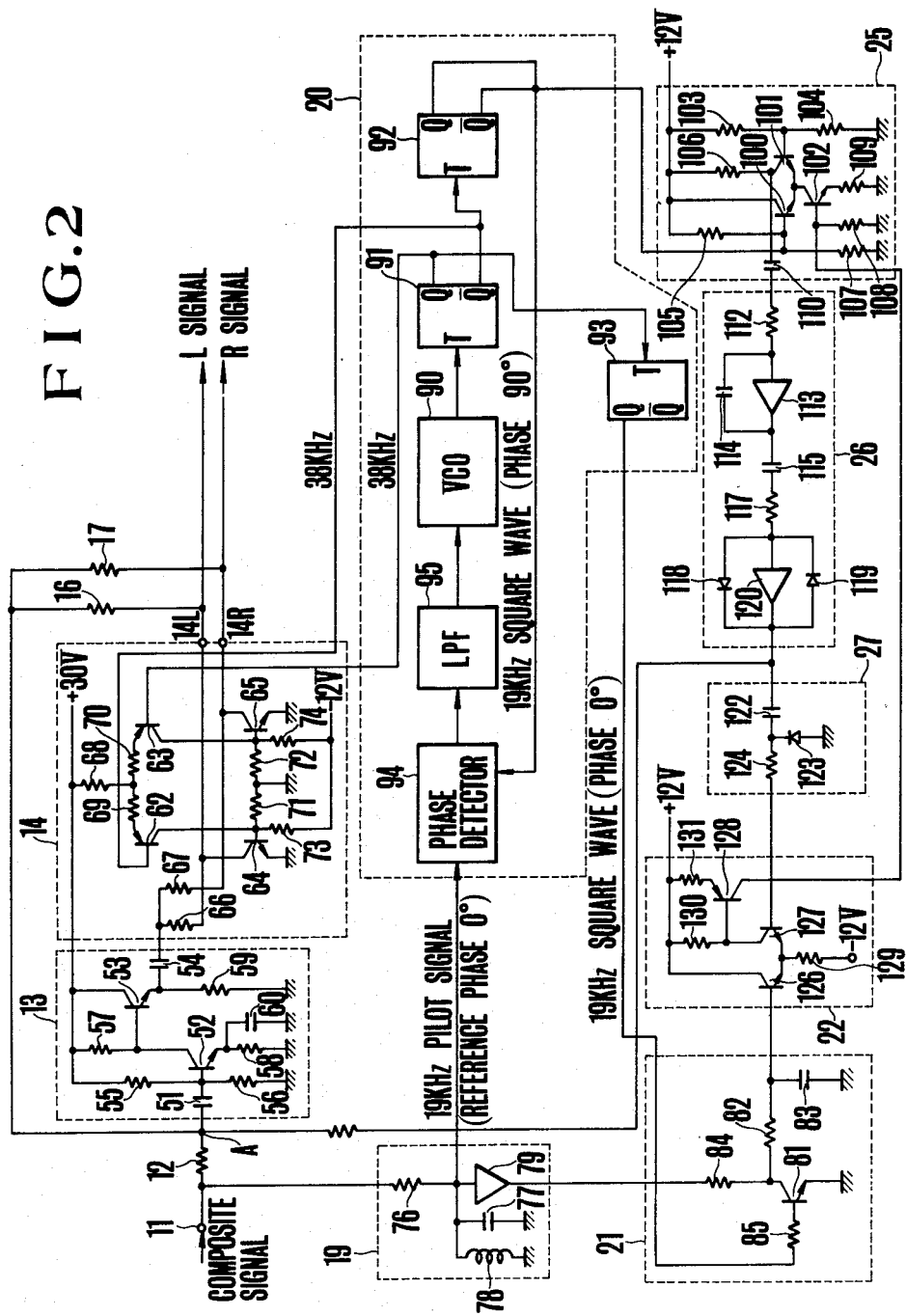
FIG. 2 is a connection diagram showing the detail of the embodiment shown in FIG. 1.

A preferred embodiment of the demodulation circuit 10 of an FM stereo receiver shown in FIG. 1 comprises an input terminal 11 adapted to receive a composite signal which is regenerated from an FM stereo wave radiated from a broadcasting station by using a pilot tone system for a well known circuit of an FM stereo receiver. Accordingly, the composite signal contains a main channel signal comprising the sum (L+R) of the left signal L and the right signal R, a sub-channel signal comprising the difference (L−R) between the left and right signals which amplitude-modulates a sub-carrier wave having a frequency of 38 kHz to produce the sub-channel signal with the sub-carrier wave suppressed, and a pilot signal having a frequency of 19 kHz. The composite signal applied to input terminal 11 is applied to an inverting amplifier 13 via a resistor 12 and the output of the amplifier 13 is applied to a switching circuit or a stereo decoder 14 which acts to separate the left channel (L) signal and the right channel (R) signal from the inverted composite signal and between its left and right output terminals 14L and 14R and the input of the inverting amplifier 13 are connected negative feedback resistors 16 and 17 respectively. The purpose of these feedback paths is to decrease the input impedance of the inverting amplifier 13 and to prevent distortion from forming in the switching circuit 14 and constitutes one of the features of this invention.

The composite signal applied to the input terminal 11 is sent to a band-pass filter (BPF) 19 having a center frequency of 19 kHz by which a pilot signal having a frequency of 19 kHz is extracted and applied to a phase-locked loop (PLL) circuit 20 and to a synchronous detector 21. As will be described later, the phase-locked loop circuit 20 comprises a voltage-controlled oscillator (VCO) having an oscillation frequency of 76 kHz, a frequency division phase detector, and a low-pass filter, and functions to detect the phase difference between the frequency-divided output signal of the voltage-controlled oscillator (VCO) and a reference signal (the output of the band-pass filter 19) so as to effect a loop control for minimizing the phase difference. Thus, the phase-locked loop circuit 20 sends a switching carrier wave having a frequency of 38 kHz to the switching circuit 14 and also produces a square wave having a frequency of 19 kHz. The synchrous detector 21 operates to synchronously detect the pilot signal produced by the band-pass filter 19 with the square wave of 19 kHz produced by the phase-locked loop circuit 20 and contains a low pass filter for producing a direct current output proportional to the 19 kHz pilot signal contained in the composite signal. The DC output of the synchronous detector 21 is applied to one input of a level comparator 22.

Among the outputs of the phase-locked loop circuit 20, the square wave having a frequency of 19 kHz is sent to a level control circuit 25 to which is also applied the output of the level comparator 22 so that the level of the 19 kHz square wave is controlled by the output of the level comparator 22. The output (19 kHz square wave) of the level control circuit 25 is sent to a waveform converting circuit 26 which converts the square wave into a sine wave. The output of the waveform converting circuit 26 is sent to a detection circuit 27 including a diode, for example, for converting the output into a DC signal proportional to the amplitude of the sine wave signal. The DC output signal from the detection circuit 27 is applied to the other input of the level comparator 22.

As above described, the level comparator compares the DC level of the output of the synchronous detector 21 with the DC level of the output of the waveform converting circuit 26 and applies their difference to the level control circuit 25 for controlling the level of the 19 kHz square wave from the phase-locked loop circuit 20.

The output of the waveform converting circuit 26 is also applied to the input of the inverting amplifier 13 via a resistor 28 to cancel the pilot signal contained in the composite signal applied at the input terminal 11. Consequently, the composite signal from which the pilot signal has been eliminated is applied to the input terminal of the inverting amplifier 13.

The waveform converting circuit 26 is used for the following reason. More particularly, the output of the phase-locked loop circuit is a square wave expressed by a Fourier series $$f(t) = \frac{1}{2} + \frac{2}{\pi}(\cos\omega_o t - \frac{1}{3}\cos 3\omega_o t + \frac{1}{5}\cos 5\omega_o t ... )$$

If this square wave were used for eliminating the pilot signal, signals other than $2/\pi \cos \omega_o t$ would be applied concurrently, thus distorting the composite signal. In contrast, when the waveform converting circuit 26 is used according to this invention, only a fundamental sine wave ($k \cos \omega_o t$, where k is a constant) is produced, and the undesired harmonic components described above are eliminated.

With the circuit described above, it is possible to synthesize a signal having the same frequency (19 kHz), phase (inverted), waveform (sine wave) and amplitude as those of the pilot signal and to cancel the pilot signal contained in the composite signal thereby completely eliminating the pilot signal from the signal sent to the switching circuit. As a consequence, only the main channel signal, that is the sum signal (L+R), and the sub-channel signal, that is a modulated difference signal (L−R), are supplied to the switching circuit 14 via the inverting amplifier 13. In this case, the synthesized signal is formed by the pilot signal contained in the composite signal by the combined action of the phase-locked loop circuit 20 and the wave form converting circuit 26 so that no harmonic components of 19 kHz signal are contained. Signals (L+R) and (L−R) sent to the switching circuit 14 are separated into signals L and R and then applied to succeeding stages through output terminals 14L and 14R respectively. Since negative feedback paths including resistors 16 and 17 are connected between the output terminals 14L and 14R and the input terminal of the inverting amplifier 13 located on the input side of the switching circuit, it is possible to decrease the input impedance of the inverting amplifier 13 thus sending its input to the switching circuit without distortion and at high fidelity without using any special circuit. Moreover, it is possible to eliminate any distortion formed in the switching circuit. For this reason, it is possible to reproduce at high fidelity distortion-free left and right signals at the output terminals of the switching circuit.

FIG. 2 shows the detailed connection of the circuit shown in FIG. 1. More particularly, the inverting amplifier 13 is connected to receive the composite signal applied to input terminal 11 through the resistor 12 and a capacitor 51 and includes an inverting transistor 52 which supplies an inverted output to a transistor 53. Since this transistor 53 is of the emitter follower type it has a low output impedance and its output is supplied to the switching circuit 14 via a capacitor 54. Resistors 55 through 59 and a capacitor 60 are provided for the purpose of setting the operating bias potentials for transistors 52 and 53. The switching circuit 14 is a well known circuit constructed to separate left and right signals L and R from the composite signal by the switching action of a 38 kHz rectangular sub-carrier wave sent from the phase-locked loop circuit 20 (two 38 kHz square waves having a phase difference of 180°). The switching circuit 14 comprises two emitter-coupled transistors 62 and 63, and transistors 64 and 65 respectively connected to the output electrodes of transistors 62 and 63. The output or collector electrodes of transistors 64 and 65 are directly connected to the output terminals 14L and 14R respectively of the switching circuit 14 and commonly connected to the output terminal of the inverting amplifier 13 via capacitor 54 and resistors 66 and 67 respectively. Resistors 68 through 74 are used to set bias potentials for transistors 62 through 65.

The band-pass filter 19 for filtering out a signal containing the 19 kHz pilot signal from the composite signal is constituted by a resistor 76, a capacitor 77, a reactor 78 and a buffer amplifier 79. The synchronous detector 21 comprises a transistor 81 which performs synchronous detection by the output from the phase-locked loop circuit 20 and a low-pass filter including a resistor 82 and a capacitor 83 and acting to smooth out the output of transistor 81. Resistors 84 and 85 are provided as a load for the transistor 81 and as limiting means for the base current of this transistor, respectively.

The phase-locked loop circuit 20 comprises a voltage-controlled oscillator (VCO) 90 having an oscillation frequency of about 76 kHz that can be controlled by an external voltage, three flip-flop circuits 91, 92 and 93 that divide the output frequency of the oscillator 90, a phase detector 94 which compares the phase of the 19 kHz input, i.e., the output of the flip-flop circuit 92 with the phase of a reference input from the band-pass filter 19 for discriminating, lagging, advancing and obtaining frequency difference of the input from the flip-flop circuit 92 with respect to the reference input, and a low-pass filter 95 which converts the output of the phase detector 94 into a direct current signal. The Q and $\bar{Q}$ outputs of flip-flop circuit 91 are respectively applied to the base electrodes of transistors 63 and 62 of the switching circuit 14 for ON-OFF controlling these transistors by the carrier wave having a frequency of 38 kHz so as to demodulate the composite signal to form L and R signals. The voltage-controlled oscillator 90 comprises a well known oscillator constructed to vary its oscillation frequency in accordance with the level of the output of the low-pass filter 95. The flip-flop circuits 91, 92 and 93 comprise T or RST type flip-flop circuits.

The level control circuit or voltage-controlled amplifier (VCA) 25 comprises two transistors 100 and 101 which form a differential amplifier, and a transistor 102 having a collector electrode connected to the commonly connected emitter electrodes of transistors 100 and 101 and constituting a source of variable voltage. The base electrode of transistor 101 is connected to a source of reference voltage constituted by resistors 103 and 104, whereas the base electrode of transistor 100 is connected to the $\bar{Q}$ output of the flip-flop circuit 92 of the phase-locked loop circuit 20, the $\bar{Q}$ output being a square wave having a frequency of 19 kHz and a duty factor of 0.5 and lagged by 90° with respect to the pilot signal. The base electrode of transistor 102 is connected to the output terminal of the level comparator 22. Resistors 105 and 107 are used to set a bias potential for the transistor 100. Resistors 106 and 108 are loads of the transistor 101 and of a transistor 128 in the level comparator 22, respectively. A resistor 109 is an emitter resistor of the transistor 102. The output of the voltage-controlled amplifier 25 is applied to the waveform converting circuit 26 via a capacitor 110. The gain of the level control circuit 25 is controlled by the magnitude of the DC control signal supplied to the base electrode of transistor 102 from the level comparator 22.

The waveform converting circuit 26 comprises an integrating circuit constituted by a resistor 112, an amplifier 113 and a capacitor 114, and a logarithmic amplifier connected to the integrating circuit through a capacitor 115 and constituted by a resistor 117, diodes 118 and 119 and an amplifier 120.

The voltage-controlled amplifier 25 amplifies a rectangular wave which is delayed by 90° from the 19 kHz reference pilot signal and the rectangular wave is supplied to the above described integrating circuit to be converted into a triangular wave lagged by 180°. The triangular wave is converted into a sine wave having a phase lag of 180° by the logarithmic amplifier. The waveform converting circuit 26 may take various forms as shown in FIGS. 3, 4 and 5. The waveform converting circuit shown in FIG. 3 is constituted by an integrating circuit and a diode limiter. The operations of these elements are identical to the operations of the elements shown in FIG. 2. The waveform converting circuits shown in FIGS. 4 and 5 are constituted by a number of cascade-connected integrating circuits. In the case shown in FIG. 4, the 90°-lagged rectangular wave having a frequency of 19 kHz is converted into a sine wave by $2n+1$ (where n is an integer) integrating circuits and an inverter, whereas in the case shown in FIG. 5, the 0° or 180°-lagged rectangular wave having a frequency of 19 kHz is converted into the sine wave by $2n$ integrating circuits and an inverter. While in FIGS. 4 and 5, a sine wave having the same phase as that of the pilot signal is formed by integrating circuits, it is also possible to form a sine wave having a phase difference of 180°, in which case the inverter may be omitted.

The detection circuit 27 is constituted by a capacitor 122, a series resistor 124 and a rectifying diode 123 and operates to convert the sine wave output of the waveform converting circuit 26 into the DC signal.

The level comparator 22 which compares the output of the synchronous detector 21 with the output of detection circuit 27 comprises emitter-coupled transistors 126 and 127 which constitute a differential amplifier, and the amplifying transistor 128 having a base electrode connected to the collector electrode of transistor 127. Resistors 129 through 131 are provided for the purpose of setting the bias potentials for transistors 126, 127 and 128. The level comparator 22 operates to apply the difference in the DC levels at the input electrodes of transistors 126 and 127 to the base electrode of transistor 102 of the level control circuit 25 via transistor 128.

Figure 6:
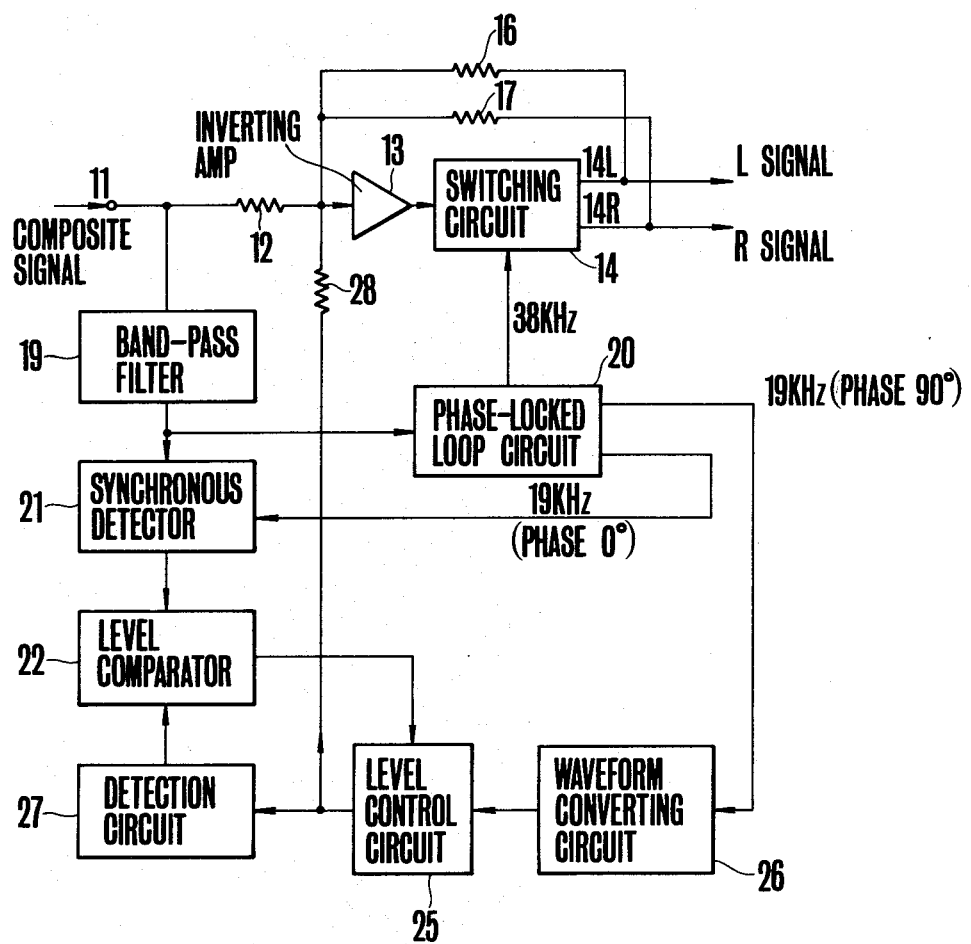
FIG. 6 is a block diagram showing another embodiment of this invention.

In a modified embodiment shown in FIG. 6, the level control circuit 25 which is connected between the phase-locked loop circuit 20 and the waveform converting circuit 26 in the embodiment shown in FIG. 1 is connected to the output of the waveform converting circuit 26.

Although in the embodiments described above, band-pass filter 19 is used to extract the pilot signal from the composite signal, this filter may be omitted if desired.

What is claimed is:

1. A demodulation circuit of an FM stereo receiver comprising:
   an inverting amplifier for inverting an FM stereo composite signal;
   a switching circuit connected to the output of said inverting amplifier for producing left and right signals on left and right output terminals;
   negative feedback circuit means connected between the input of said inverting amplifier and said left and right output terminals respectively;
   a phase-locked loop circuit for controlling said switching circuit, said phase-locked loop circuit including means for generating a switching signal and a rectangular wave signal in response to a pilot signal contained in said composite signal, said rectangular wave signal having the same frequency as said pilot signal;
   a waveform converting circuit for converting said rectangular wave signal into a sine wave signal which is equal in frequency and opposite in phase with respect to said pilot signal;
   a control circuit having a control input for controlling the amplitude of said sine wave signal in accordance with a signal at said control input;

a first detection circuit for generating a first direct current signal proportional to the amplitude of said amplitude-controlled sine wave signal;

a second detection circuit for synchronously detecting said pilot signal in accordance with said rectangular wave signal and for generating a second direct current signal;

a comparator for comparing the levels of said first and second direct current signals to generate a comparison signal supplied to said control input of said control circuit; and means for supplying said amplitude-controlled sine wave signal to the input of said inverting amplifier thereby cancelling the pilot signal in said composite signal.

2. The demodulation circuit according to claim 1 wherein said control circuit is connected between said phase-locked loop circuit and said waveform converting circuit.

3. The demodulation circuit according to claim 1 wherein said control circuit is connected between said waveform converting circuit and said detection circuit.

4. The demodulation circuit according to claim 1 wherein said waveform converting circuit comprises an integrating circuit and a logarithmic amplifier.

5. The demodulator circuit according to claim 1 wherein said waveform converting circuit comprises a plurality of integrating circuits.

6. The demodulation circuit according to claim 1 wherein said waveform converting circuit comprises an integrating circuit and a diode limiter.

7. The demodulation circuit according to claim 1 wherein said rectangular wave produced by the phase-locked loop circuit is a square wave having a duty factor of 0.5.

* * * * *